(12) United States Patent
Lin

(10) Patent No.: US 6,291,882 B1
(45) Date of Patent: Sep. 18, 2001

(54) PACKAGING PROCESS AND STRUCTURE OF ELECTRONIC DEVICE

(75) Inventor: Yung-Sen Lin, Taichung Hsien (TW)

(73) Assignee: Siliconware Precision Industries Co., Letd., Taichung Hsien (TW)

( * ) Notice: Subject to any disclaimer, the term of this patent is extended or adjusted under 35 U.S.C. 154(b) by 0 days.

(21) Appl. No.: 09/586,523

(22) Filed: Jun. 2, 2000

(51) Int. Cl.⁷ .................................................... H01L 23/06
(52) U.S. Cl. ........................ 257/729; 257/678; 438/125
(58) Field of Search .................................. 257/729, 701, 257/678, 787; 438/125, 118, 26, 127

(56) References Cited

U.S. PATENT DOCUMENTS

| | | | |
|---|---|---|---|
| 4,675,094 | * | 6/1987 | Kaminaga et al. . |
| 5,215,643 | * | 6/1993 | Kusanagi et al. . |
| 5,296,122 | * | 3/1994 | Katsube et al. . |
| 5,542,171 | | 8/1996 | Freyman et al. . |
| 5,635,671 | | 6/1997 | Tuskey et al. . |
| 5,846,708 | * | 12/1998 | Hollis et al. . |
| 6,087,000 | * | 7/2000 | Girgis et al. . |
| 6,193,077 | * | 2/2001 | Withan et al. . |

* cited by examiner

*Primary Examiner*—Sheila V. Clark
(74) *Attorney, Agent, or Firm*—Jiawei Huang; J. C. Patents

(57) ABSTRACT

A packaging process and structure of electronic device provides first a substrate having a carrying surface and a mounting surface wherein the carrying surface is divided into a device disposing region and a device peripheral region. Then a hydrophobic Fluorine-containing layer is formed in the device peripheral region of the substrate. Subsequently, an electronic device is attached in the device disposing region and is electrically connected to the substrate. Then, a molding compound is employed to encapsulate the electronic device. The bondability between the hydrophobic Fluorine-containing layer and the molding compound is weaker than the bondability between the molding compound and the substrate. Finally, a degating process is performed to remove the excess molding compound positioned at the hydrophobic Fluorine-containing layer to accomplish the packaging process of the electronic device.

24 Claims, 5 Drawing Sheets

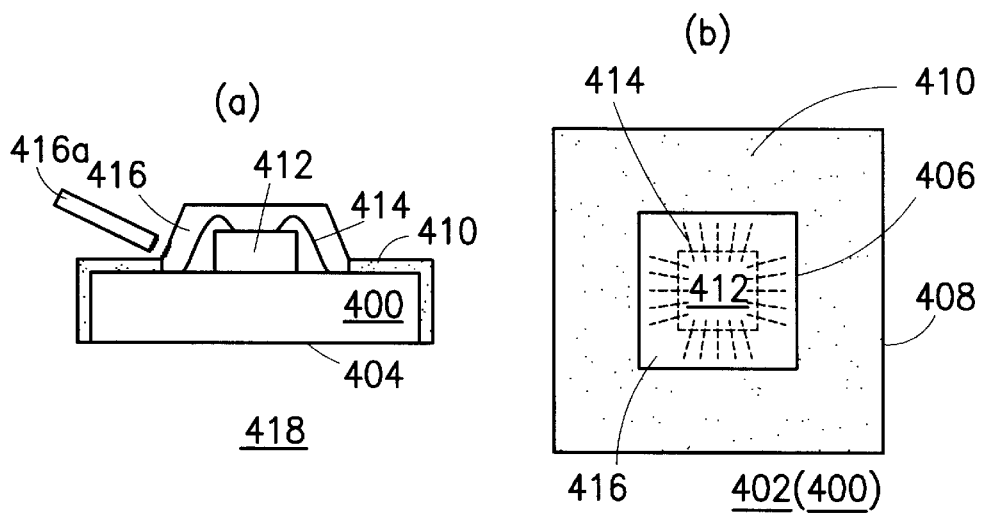
FIG. 4E
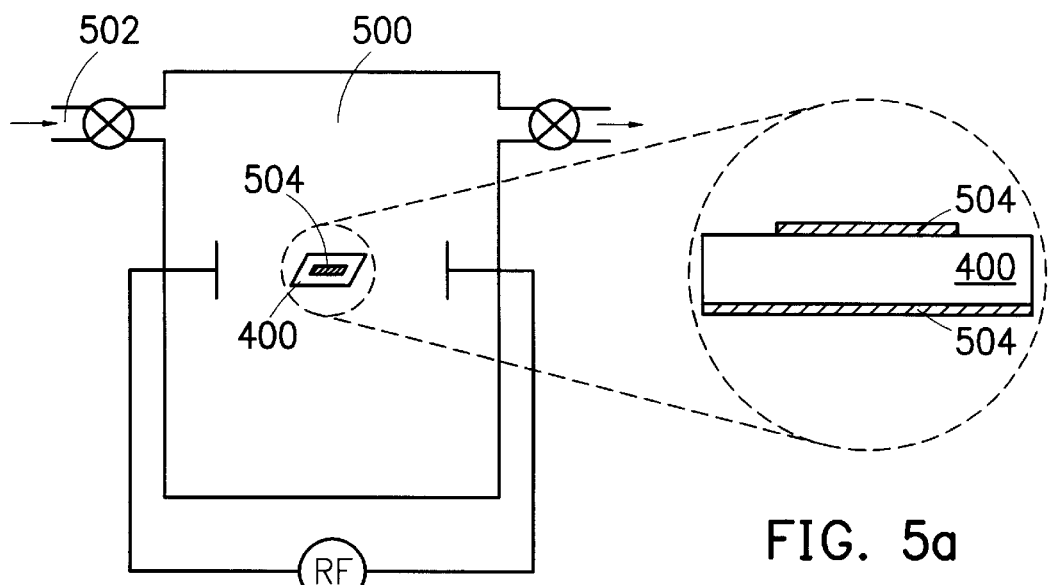
FIG. 5a
FIG. 5

PACKAGING PROCESS AND STRUCTURE OF ELECTRONIC DEVICE

BACKGROUND OF THE INVENTION

1. Field of the Invention

This invention relates to a packaging process and structure of an electronic device, and more particularly to a packaging process and structure of an electronic device of an IC (integrated circuit) chip.

2. Description of Related Art

In IC industry, IC package is used for providing the chip with a medium of electrical connection to a PCB (printed circuit board) or to other appropriate devices. In addition, the package also provides the chip a protection from being damaged or short-circuit. And the packaging process is the last process in making the IC products. The IC circuit is generally encapsulated in a package and is then bonded to the PCB or other substrates.

During the packaging process, a two-piece molding equipment is normally employed and a molding compound is generally used to perform encapsulating process for the electronic devices such as IC chip. A chip-carrying substrate is placed into the cavity of a mold, then the molding compound is introduced into the cavity through the mold runner of the mold to encapsulate the chip, afterward, the mold is separated from the package after the molding compound is cured. At this moment, however, since the package is still connected to the molding compound that is cured and is positioned in the mold runner, a degating process is then performed to remove the excess portion so as to accomplish the fabrication of an electronic package.

However, since there are bonding forces existed between the substrate and the molding compound that is positioned in the mold runner, while performing the degating process to remove the excess portion of the molding compound, the substrate will be twisted. In turn, the solder mask on the substrate is impaired, the conductive trace is cracked, and delamination occurs between the molding compound, solder mask, conductive trace, chip, and the substrate, consequently, gaps are generated. Subsequently, moisture penetrates into the gaps which results in the moisture expansion due to the heat to generate the "Popcorn Effect" that eventually damages the package.

Shown in FIG. 1 is a top view of a package substrate according to the prior art presented in 1994 by Amkor Company and Anam Company with U.S. Pat. No. 5,635,671. A Degating Region 102 made of Gold (Au) or Palladium (Pd) is formed on the mold runner 104 of the substrate. The width of the Degating Region 102 is greater 15 than that of the mold runner 104. Since the bondability of the molding compound to the gold Degating Region 102 is smaller than the bondability of the molding compound to the substrate 100, the package structure will not be damaged when it comes to removing the excess molding compound in the mold runner. But the gold Degating Region 102 occupies the substrate area available for the circuit pattern, besides, the fabrication of the gold Degating Region 102 will increase the manufacturing cost of the package.

Shown in FIG. 2 is an isometric view of a schematic drawing showing the process of removing the excess molding compound according to the prior art presented in 1991 by Motorola Company with U.S. Pat. No. 5,542,171. As shown in the FIG. 2, a sputter etching process is performed to a substrate 200 in order to enhance the bondability between the molding compound and the substrate in the subsequent process. Then a contamination process is performed that a coating layer 206 of permanent marking ink or polymer is applied on the contact area between the substrate 200 and a gate 204 through which the mold runner 210 is connected to the semiconductor chip 202. The coating layer 206 is applied for reducing the bondability between the molding compound and the substrate such that the package structure will not be damaged when it comes to removing the excess molding compound in the mold runner. But the above-mentioned coating process by using the permanent marking ink or polymer is complicated and difficult. The method not only increases the manufacturing cost but also has the concern of damaging the quality of the products.

SUMMARY OF THE INVENTION

It is therefore an objective of the present invention to provide a packaging process and structure to form a hydrophobic Fluorine-containing layer in a novel region on the packaging substrate without affecting the available circuit pattern area on the substrate. This layer can lower the bondability between the substrate and the molding compound positioned in the mold runner. The forming of the layer can protect the package from being damaged during the degating process since the bondability between the hydrophobic Fluorine-containing layer and the molding compound is weaker than the bondability between the molding compound and the substrate. It can also restrain the moisture from penetrating into the package to generate popcorn effect.

In order to attain the foregoing objectives, the present invention presents a packaging process and structure of electronic device. It provides first a substrate having a carrying surface and a mounting surface wherein the carrying surface is divided into a device disposing region and a device peripheral region. Then a hydrophobic Fluorine-containing layer is formed in the device peripheral region of the substrate. Subsequently, an electronic device is attached in the device disposing region and is electrically connected to the substrate. Then, a molding compound is employed to encapsulate the electronic device. The bondability between the hydrophobic Fluorine-containing layer and the molding compound is weaker than the bondability between the molding compound and the substrate. Finally, a degating process is performed to remove the excess molding compound positioned at the hydrophobic Fluorine-containing layer to accomplish the packaging process of the electronic device.

Additionally, in order to attain the foregoing objectives, the present invention provides also a substrate having a carrying surface, a hydrophobic Fluorine-containing layer, an electronic device, and a molding compound. The carrying surface has a device disposing region and a device peripheral region. The hydrophobic Fluorine-containing layer is positioned in the device peripheral region to cover a portion of the substrate. The electronic device is attached in the device disposing region and electrically connected to the substrate. And the molding compound is disposed in the device disposing region to encapsulate the electronic device wherein the bondability between the hydrophobic Fluorine-containing layer and the molding compound is weaker than the bondability between the molding compound and the substrate and/or the electronic device.

BRIEF DESCRIPTION OF DRAWINGS

The objectives, characteristics, and advantages of the present invention can be more fully understood by reading the following detailed description of the preferred embodiments, with reference made to the accompanying drawings as follows:

FIG. 4A to FIG. 4E are schematic packaging drawings according to a preferred embodiment of the present invention.

FIG. 5 is a schematic drawing showing a packaging process of an electronic device to form a hydrophobic Fluorine-containing layer according to a preferred embodiment of the present invention.

DETAILED DESCRIPTION OF PREFERRED EMBODIMENT

Figure 1:
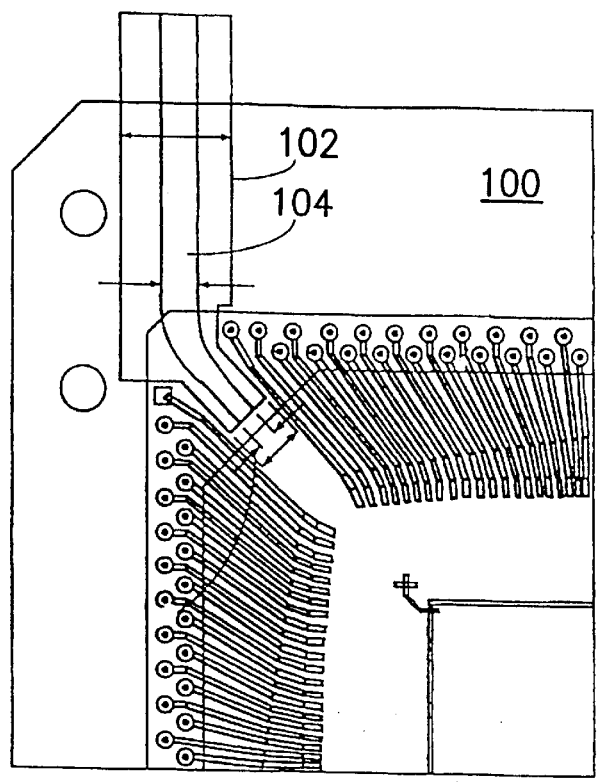
FIG. 1 is a top view of a package substrate according to a prior art.
Figure 2:
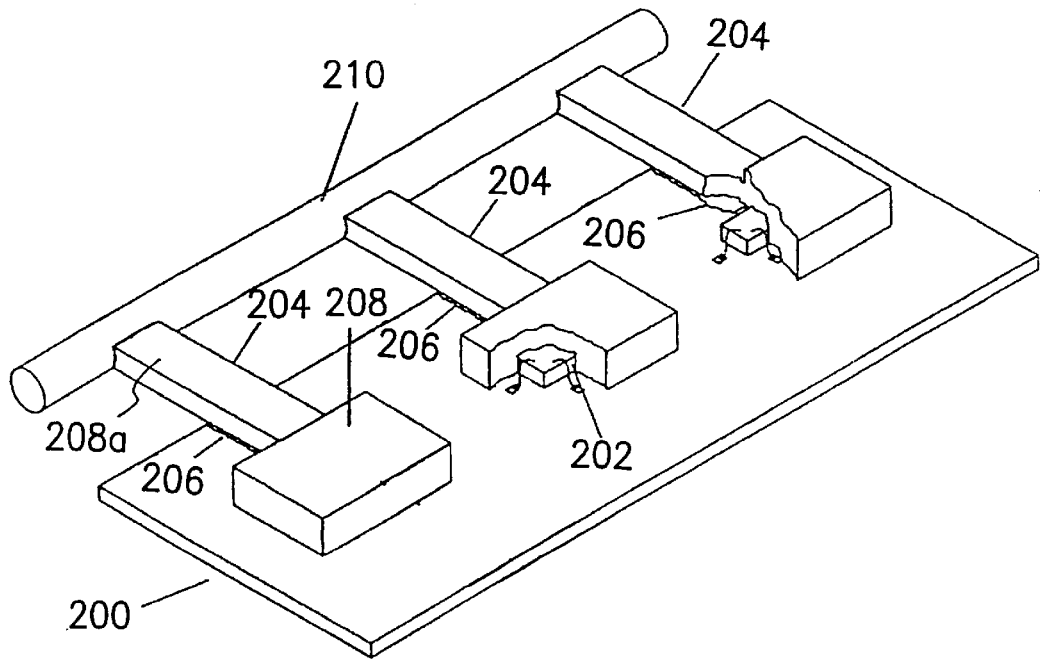
FIG. 2 is an isometric schematic drawing showing a process to remove the excess portion of molding compound according to another prior art.
Figure 3:
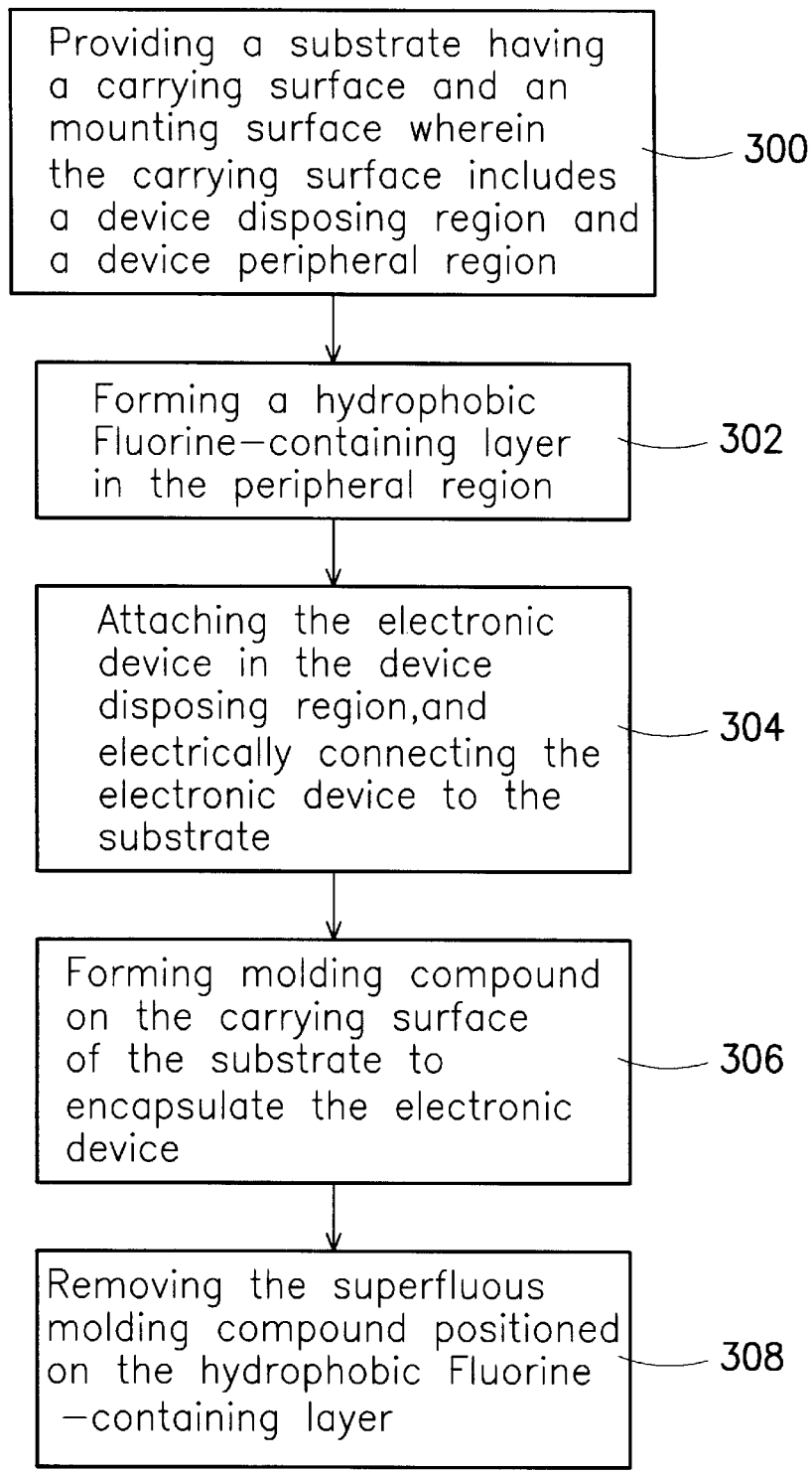
FIG. 3 is a packaging flow chart of an electronic device according to a preferred embodiment of the present invention.

FIG. 3 is a packaging flow chart of an electronic device according to a preferred embodiment of the present invention. FIG. 4A to FIG. 4E are schematic packaging drawings according to the preferred embodiment of the present invention. The step numbers 300, 302, 304, 306, 308 correspond respectively to the packaging step drawings FIG. 4A to FIG. E.

Figure 4A:
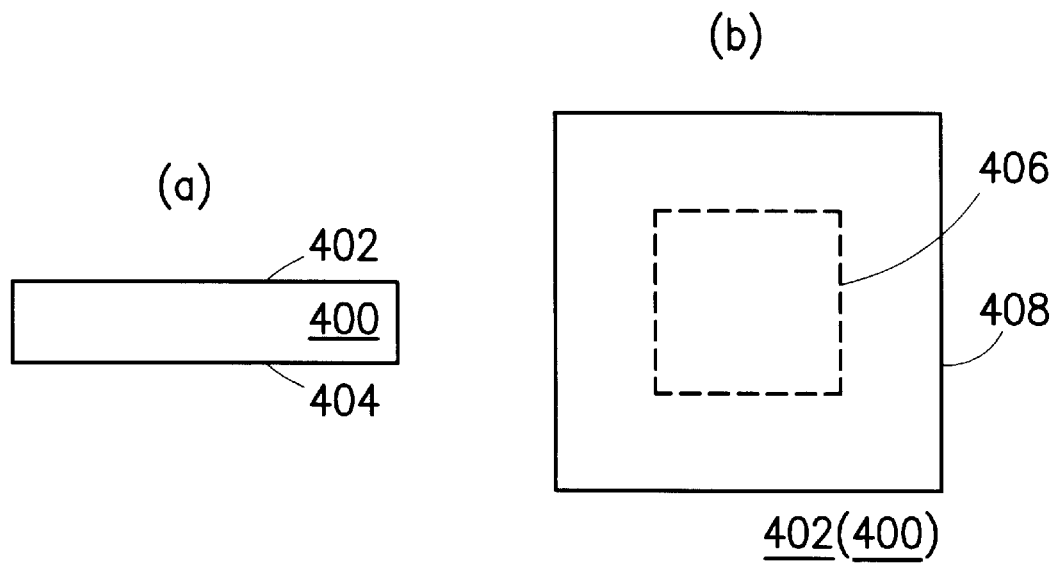

As shown in the flow chart step 300 of FIG. 3 and its corresponding packaging step in FIG. 4A, a substrate 400 is first provided for performing packaging. The surface of the substrate 400 includes a carrying surface 402 for carrying the device, for example, the die attaching surface for carrying the semiconductor chip, and a mounting surface 404. The drawing in FIG. 4A includes a top view and a cross-sectional view of a portion of the region of the packaging substrate 400 wherein the carrying surface 402 has conductive traces (not shown). In addition, the carrying surface 402 is also divided into a device disposing region 406 and a device peripheral region 408 on the peripheral of the device disposing region 406. The mounting surface 404 has the solder ball pads (not shown) required for electrically connecting to the other devices or substrate.

Figure 4B:
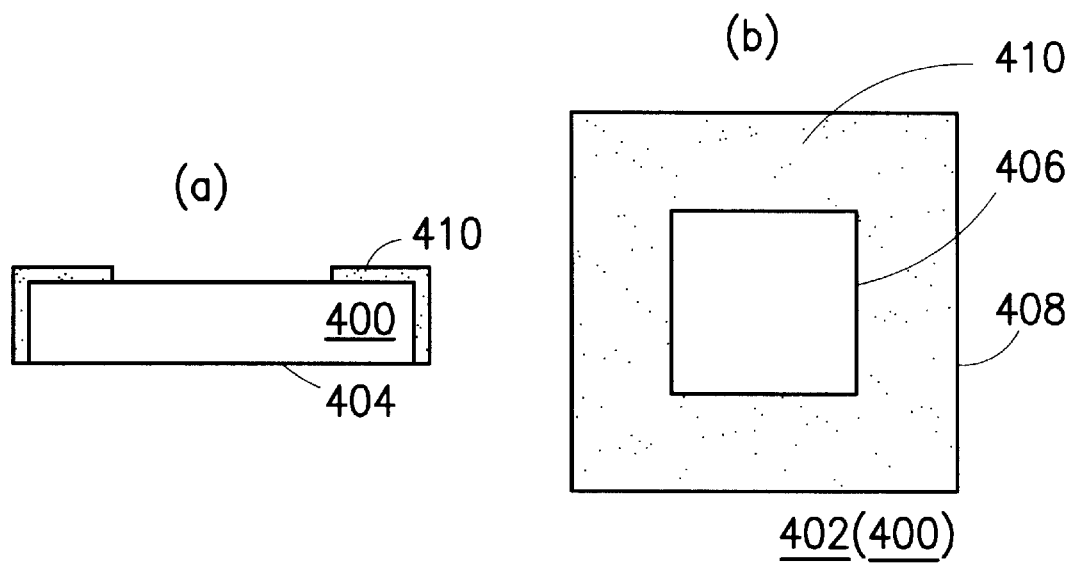

Next, as shown in the flow chart step 302 of FIG. 3 and its corresponding packaging step in FIG. 4B, a hydrophobic Fluorine-containing layer 410 having a thickness of 10 Å (Angstrom)~1,000 Å is formed in the device peripheral region 408 on the carrying surface 402 of the substrate 400. Processes for forming the hydrophobic Fluorine-containing layer 410 include CVD (Chemical Vapor Deposition), for example, a PECVD (Plasma Enhanced Chemical Vapor Deposition).

FIG. 5 is a schematic drawing showing a packaging process of an electronic device to form a hydrophobic Fluorine-containing layer according to a preferred embodiment of the present invention. As shown in FIG. 5, same part numbers are employed as those of the ones shown in FIG. 4A and FIG. 4B. The substrate 400 is placed in the reacting chamber 500 wherein the device disposing region 406 and the mounting region 404 on the substrate 400 are covered by a Mask 504. Thereafter, plasma gas coming from the pipe line 502 is introduced into the reacting chamber 500 in order to perform PECVD to form on the substrate 400 a hydrophobic Fluorine-containing layer 410 covering the device peripheral region 408 and the side wall portion of the substrate 400.

While performing PECVD, the source of plasma gas employed includes Carbon-Fluoro Compound, for example, Perfluo-Carbon Compound, such as Ethane compound and Alkene compound etc. And the Ethane compound for forming hydrophobic Fluorine-containing layer 410 includes Hexafluoro-Ethane ($C_2F_6$) etc. while Alkene compound includes Tetrafluoro-Ethylene etc.

Figure 4C:
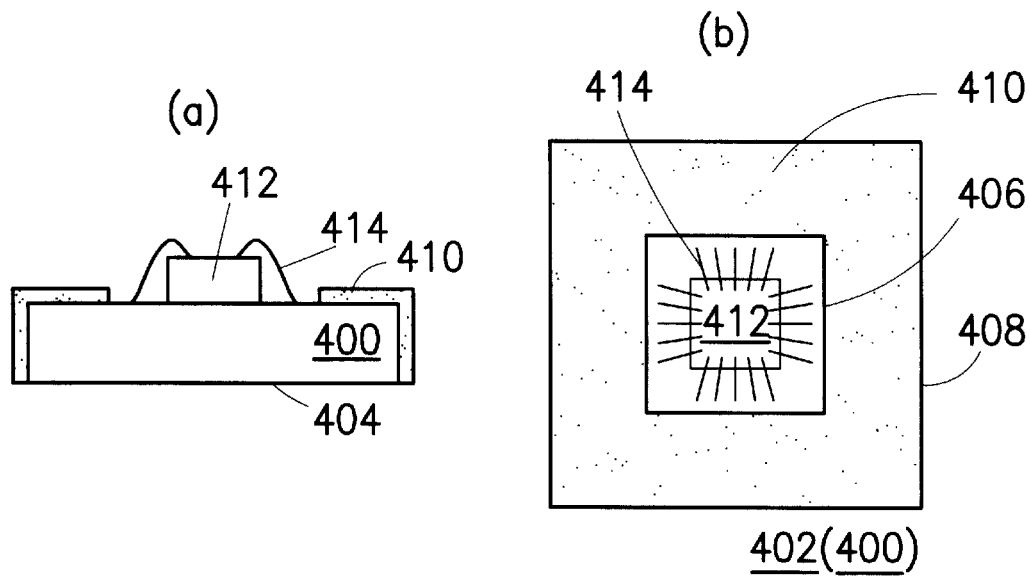

Subsequently, as shown in the flow chart step 304 of FIG. 3 and its corresponding packaging step in FIG. 4C, an electronic device 412 is attached in the device disposing region 406 of the substrate 400 and is electrically connected to the substrate 400. The electronic device includes semiconductor device such as IC (integrated circuit) chip etc. The electronic device 412 is attached to the device disposing region 406 on the substrate 400 by employing adhesive (not shown) such as insulative adhesive, electrically conductive adhesive or tape. Wire Bonding (W/B) method is employed to electrically connect the electronic device 412 to the substrate 400 to form bonding wires 414 between the bonding pads (not shown) on the electronic device and the conductive traces on the substrate 400.

Although the device disposing region 406 in FIG. 4A and FIG. 4B and the mask 504 appear square in shape, they are used only for explanation in the present embodiment and are not for limiting the scope of the present invention. Also, employing the wire bonding method to form bonding wires 414 for the electrical connection between the electronic device 412 and the substrate 400 is used only for explanation in the present embodiment and is not for limiting the scope of the present invention either. Other methods of electrical connection such as TAB (Tape Automated Bonding) or FC (Flip Chip) can also be employed.

Figure 4D:
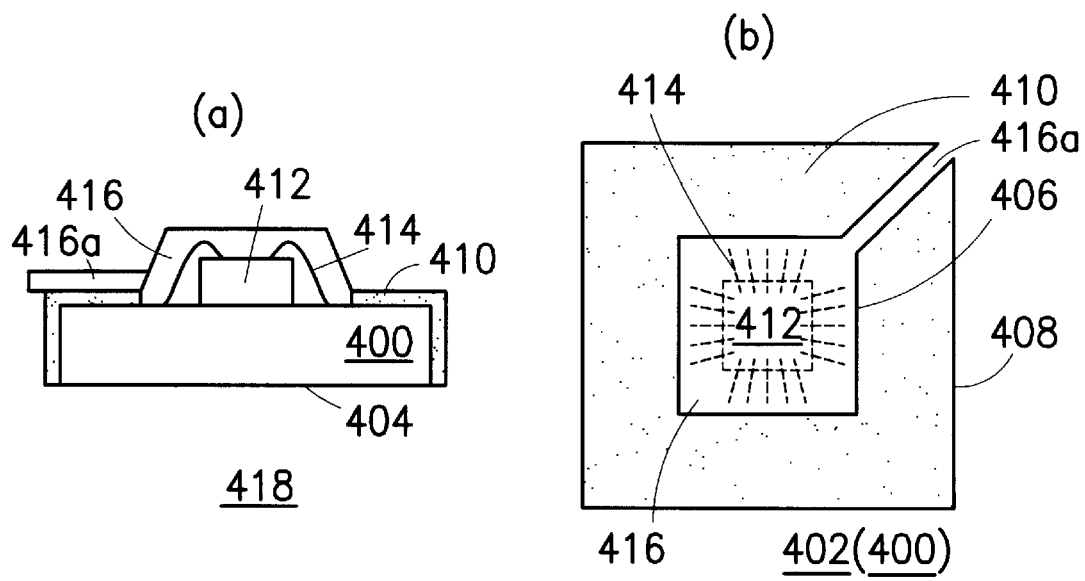

Then as shown in the flow chart step 306 of FIG. 3 and its corresponding packaging step in FIG. 4D, an encapsulating process is performed for the substrate 400 having the device attached thereon. Molding compound 416 is employed to form on the carrying surface 402 of the substrate 400 to encapsulate the electronic device 412. The encapsulating process is performed by the use of a two-piece mold for example, to place the substrate 400 in the molding cavities of the mold. Thereafter, a Transfer Molding or an Injection Molding method is employed to introduce the molding compound into the molding cavities through the mold runner 416a to encapsulate the device, the package is then separated from the mold after the molding compound is cured. The employed molding compound 416 includes Thermosetting Epoxy Resin etc. Besides, the material selection for the hydrophobic Fluorine-containing layer is something to do with the material selection for the molding compound and the substrate, that is, the bondability between the molding compound and the hydrophobic Fluorine-containing layer must be weaker than the bondability between the molding compound and the substrate.

Finally, as shown in the flow chart step 308 of FIG. 3 and its corresponding packaging step in FIG. 4E, a degating process is performed to remove the excess molding compound that is positioned in the mold runner 416a. It is very easy to remove the excess molding compound from the hydrophobic Fluorine-containing layer in the degating process since the bondability between the molding compound and the hydrophobic Fluorine-containing layer is weaker than the bondability between the molding compound and the substrate. Therefore, the hydrophobic Fluorine-containing layer can facilitate the performing of the subsequent automation process. Besides, the hydrophobic Fluorine-containing layer can protect the substrate and package from being distorted and damaged, and to prevent the electronic device from being cracked in the degating process. Moreover, the forming of the hydrophobic Fluorine-containing layer at the peripheral region of the device can restrain the moisture from penetrating into the package so as to avoid the generation of "popcorn effect."

To summarize the foregoing statement, the present invention includes at least the following advantages:

1. The packaging process and structure of electronic device of the present invention is to form a hydrophobic Fluorine-containing layer in the device peripheral region on the substrate to lower the bondability of the excess molding compound in the device peripheral region to the substrate. Since the mold runner is positioned in the device peripheral region during the encapsulating process, when it comes to removing the excess molding compound that is positioned in the mold runner and is cured to make it separate from the package body, the package body will not be damaged. Therefore, the packaging yield is improved and the package's service life is prolonged.
2. The packaging process and structure of electronic device of the present invention is to form a hydrophobic Fluorine-containing layer in the device peripheral region on the substrate to restrain moisture from penetrating into the package. Therefore, the package structure of the present invention can avoid the occurrence of popcorn effect and prolong its service life.
3. Since the hydrophobic Fluorine-containing layer being applied on the surface of the substrate will not occupy the area available for circuit pattern on the substrate, the package structure of the present invention is applicable to the package substrate having high density of circuit pattern.
4. Since the packaging process and structure of electronic device of the present invention can employ the two-piece mold that is widely used in the packaging process nowadays without the needs of redesigning and making new mold or employing the complicated three-piece mold, or the modified two-piece mold, the manufacturing cost can be reduced.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A package of an electronic device comprising:
   a substrate having a carrying surface wherein the carrying surface has a device disposing region and a device peripheral region;
   a hydrophobic Fluorine-containing layer positioned in the device peripheral region to cover a portion of the substrate;
   an electronic device attached in the device disposing region and electrically connected to the substrate; and
   a molding compound disposed in the device disposing region to encapsulate the electronic device wherein the bondability between the hydrophobic Fluorine-containing layer and the molding compound is weaker than the bondability between the molding compound and the substrate.

2. The package of the electronic device of claim 1 wherein the material used for forming the hydrophobic Fluorine-containing layer comprises carbon-fluoro compound.

3. The package of the electronic device of claim 2 wherein the material used for forming the hydrophobic Fluorine-containing layer comprises perfluoro-carbon compound.

4. The package of the electronic device of claim 2 wherein the reactant used for forming the hydrophobic Fluorine-containing layer comprises Ethane compound and Alkene compound.

5. The package of the electronic device of claim 4 wherein the Ethane compound used for forming the hydrophobic Fluorine-containing layer comprises Hexafluoro-Ethane ($C_2F_6$).

6. The package of the electronic device of claim 4 wherein the Alkene compound used for forming the hydrophobic Fluorine-containing layer comprises Tetrafluoro-Ethylene.

7. The package of the electronic device of claim 1 wherein the formed hydrophobic Fluorine-containing layer has a thickness in the range of 10 Å~1,000 Å (Angstrom).

8. The package of the electronic device of claim 1 wherein the electronic device comprises IC (Integrated Circuit) chip.

9. The package of the electronic device of claim 1 further comprising a plurality of bonding wires disposed between the electronic device and the substrate and electrically connected between the electronic device and the substrate.

10. The package of the electronic device of claim 2 wherein the material used for forming the molding compound comprises Thermosetting Epoxy Resin.

11. A packaging process of an electronic device comprising:
    providing a substrate having a carrying surface and a mounting surface wherein the carrying surface has a device disposing region and a device peripheral region;
    forming a hydrophobic Fluorine-containing layer in the device peripheral region to cover a portion of the substrate;
    attaching an electronic device in the device disposing region and electrically connect the electronic device to the substrate;
    forming a molding compound on the carrying surface to encapsulate a portion of the electronic device, a portion of the carrying surface, and a portion of the substrate wherein the bondability between the hydrophobic Fluorine-containing layer and the molding compound is weaker than the bondability between the molding compound and the substrate; and
    removing a portion of the molding compound positioned on the hydrophobic Fluorine-containing layer.

12. The packaging process of the electronic device of claim 11 wherein the process for forming the hydrophobic Fluorine-containing layer comprises Chemical Vapor Deposition (CVD).

13. The packaging process of the electronic device of claim 12 wherein the process for forming the hydrophobic Fluorine-containing layer comprises Plasma Enhanced Chemical Vapor Deposition (PECVD).

14. The packaging process of the electronic device of claim 13 wherein a source of the plasma gas used for forming the hydrophobic Fluorine-containing layer comprises carbon-fluoro compound.

15. The packaging process of the electronic device of claim 14 wherein the carbon-fluoro compound used for forming the hydrophobic Fluorine-containing layer comprises perfluoro-carbon compound.

16. The packaging process of the electronic device of claim 14 wherein the carbon-fluoro compound used for forming the hydrophobic Fluorine-containing layer comprises Ethane compound and Alkene compound.

17. The packaging process of the electronic device of claim 16 wherein the Ethane compound used for forming the hydrophobic Fluorine-containing layer comprises Hexafluoro-Ethane ($C_2F_6$).

18. The packaging process of the electronic device of claim 16 wherein the Alkene compound used for forming the hydrophobic Fluorine-containing layer comprises Tetrafluoro-Ethylene.

19. The packaging process of the electronic device of claim 11 wherein the formed hydrophobic Fluorine-containing layer has a thickness in the range of 10 Å~1,000 Å (Angstrom).

20. The packaging process of the electronic device of claim 11 wherein the process for forming the hydrophobic Fluorine-containing layer comprises a step of using a mask to cover all of the device disposing region and the mounting region.

21. The packaging process of the electronic device of claim 11 wherein the process of electrically connecting the electronic device to the substrate comprises wire bonding.

22. The packaging process of the electronic device of claim 11 wherein the process of electrically connecting the electronic device to the substrate comprises Tape Automated Bonding (TAB).

23. The packaging process of the electronic device of claim 11 wherein the process of electrically connecting the electronic device to the substrate comprises Flip Chip (FC).

24. The packaging process of the electronic device of claim 11 wherein the material used for forming the molding compound comprises Thermosetting Epoxy Resin.

* * * * *